(12) United States Patent
Zha

(10) Patent No.: US 7,924,567 B2
(45) Date of Patent: Apr. 12, 2011

(54) HEAT DISSIPATION DEVICE

(75) Inventor: Xin-Xiang Zha, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 58 days.

(21) Appl. No.: 12/465,586

(22) Filed: May 13, 2009

(65) Prior Publication Data

US 2010/0020500 A1    Jan. 28, 2010

(30) Foreign Application Priority Data

Jul. 23, 2008  (CN) .......................... 2008 1 0302953

(51) Int. Cl.
*H05K 7/20* (2006.01)
*G06F 1/20* (2006.01)

(52) U.S. Cl. .................... 361/710; 361/679.54; 361/704; 361/709; 361/719; 165/80.2; 165/185; 174/16.3; 24/458; 248/505; 248/510

(58) Field of Classification Search ............. 361/679.46, 361/679.54, 690, 704–704, 709–710, 719; 165/80.2–80.3, 185; 174/16.3; 24/457–458; 248/505, 510

See application file for complete search history.

(56) References Cited

U.S. PATENT DOCUMENTS

| | | | |
|---|---|---|---|
| 5,396,402 A * | 3/1995 | Perugini et al. ............... | 361/704 |
| 6,229,705 B1 * | 5/2001 | Lee ............................... | 361/704 |
| 6,256,846 B1 * | 7/2001 | Lee ............................... | 24/459 |
| 6,362,963 B1 * | 3/2002 | Lee et al. ....................... | 361/704 |
| 6,404,635 B1 * | 6/2002 | Wei ............................... | 361/704 |
| 7,433,194 B2 * | 10/2008 | Wu et al. ....................... | 361/719 |
| 7,478,667 B2 * | 1/2009 | Yang ............................. | 165/80.2 |
| 2007/0139891 A1 | 6/2007 | Yu et al. | |

* cited by examiner

*Primary Examiner* — Robert J Hoffberg
(74) *Attorney, Agent, or Firm* — Frank R. Niranjan

(57) ABSTRACT

A clip includes a main body, a pair of locking members integrally formed at opposite ends of the main body, and a securing member secured onto one of the locking members. The one locking member includes an upper portion, a lower portion wider than the upper portion, and a step between the upper and lower portions. The securing member includes a handling portion and an engaging portion extending downwardly from the handling portion. A pair of flanges are formed on the engaging portion facing the main body and abutting the step. A clearance is defined between the flanges and the engaging portion receiving the upper portion. One of the engaging portion and the one locking member forms an engaging hole, and the other one forms a hook engaging into the engaging hole.

13 Claims, 6 Drawing Sheets

HEAT DISSIPATION DEVICE

BACKGROUND

1. Technical Field

The disclosure generally relates to heat dissipation devices, and particularly to a clip used for securing a heat dissipation device to an electronic component.

2. Description of Related Art

It is well-known that heat is generated by electronic components, such as CPUs of computers. If the heat is not rapidly and efficiently removed, the electronic component may overheat and the performance thereof may be significantly degraded. Generally, a heat dissipation device, such as a heat sink, is attached to the electronic component for a cooling purpose, and a fastening device, such as a clip, is generally required to attach the heat sink to the electronic component.

For example, US Patent Application Publication No. 2007/0139891A1 discloses a clip used for securing a heat sink to a CPU which is mounted on a circuit board. The clip includes a spring member having an elongated main body, an actuating member and an assisting member. A first locking member extends from one end of the main body integrally, and a second locking member coupled to the other end of the main body via a connecting member. The actuating member connects pivotally with the second locking member. The assisting member is located between the actuating member and the connecting member of the main body.

The actuating member forms a handle portion at one end thereof and a round rotating portion at the other end thereof. The rotating portion includes a plurality of teeth formed on a circumferential surface thereof. The assisting member includes a wedged main body and forms an inclined top surface at a top of the wedged main body. The assisting member further forms a plurality of teeth on the inclined top surface thereof for engaging the corresponding teeth of the actuating member. In operation, the actuating member is rotated to move the second locking member from a released position to an abutting position, to impel the heat sink toward the CPU. The clip can be easily operated by hand, without requiring undue force. However, numerous components of the clip are required, and assembly the clip is complex.

What is needed, therefore, is a heat dissipation device incorporating a clip for securing the heat dissipation device to an electronic component which overcomes the described limitations.

DETAILED DESCRIPTION

Figure 1:
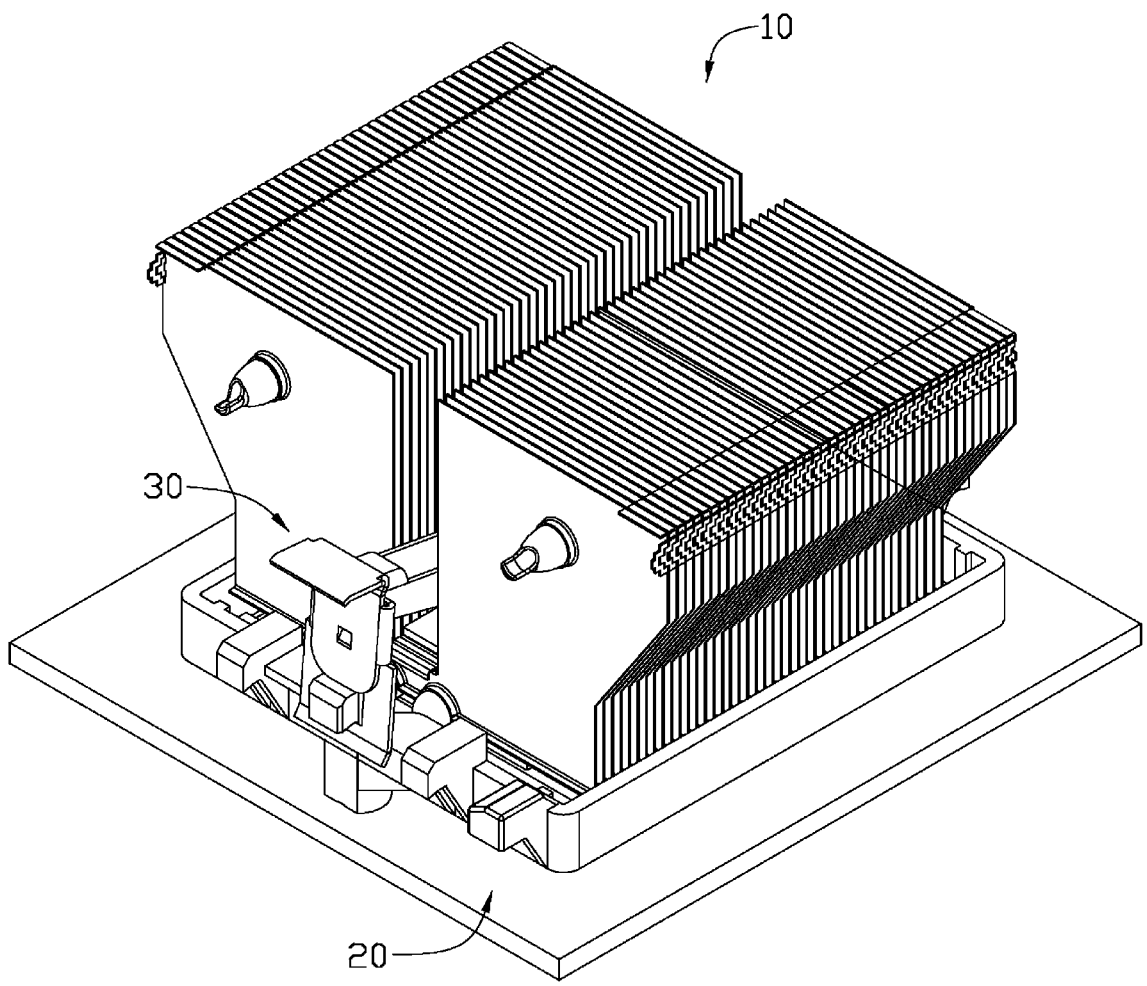
FIG. 1 is an isometric, assembled view of a heat dissipation device according to an exemplary embodiment.
Figure 2:
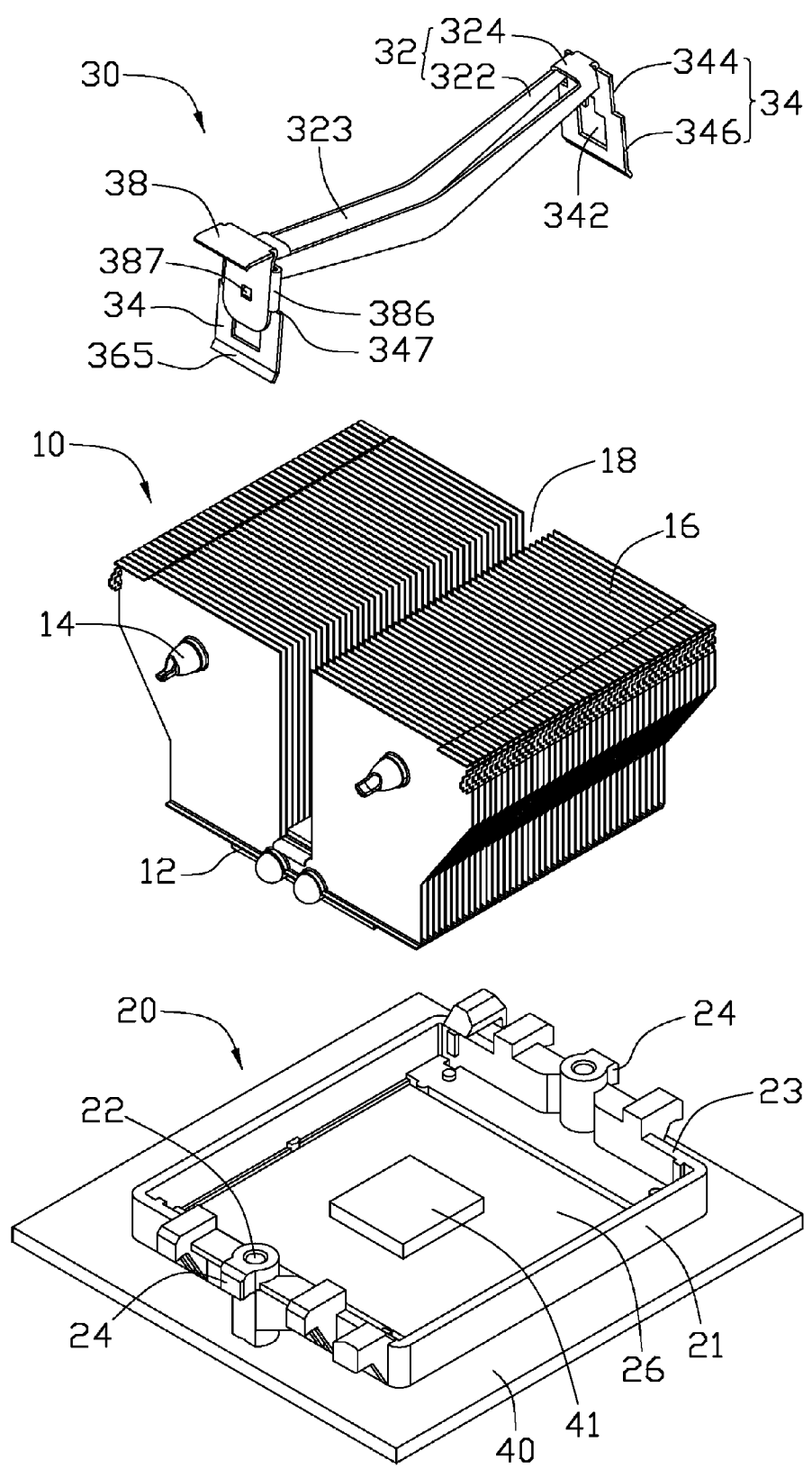
FIG. 2 is an exploded view of the heat dissipation device of FIG. 1.

Referring to FIGS. 1 and 2, a heat dissipation device in accordance with an exemplary embodiment includes a heat sink 10, a retention frame 20, and a clip 30. The heat sink 10 is positioned on an electronic component 41, such as a central processing unit (CPU), mounted on a circuit board 40 for dissipating heat generated by the electronic component 41.

The heat sink 10 includes a base 12, a fin assembly 16 and a pair of heat pipes 14. The base 12 is thermally attached to the electronic component 41 to absorb heat therefrom. The fin assembly 16 is arranged on the base 12, and includes a plurality of fins stacked together. The pair of heat pipes 14 each have one end embedded in the base 12 and another end extending through the fin assembly 16, for transferring heat from the base 12 to the fin assembly 16 for dissipation. The fin assembly 16 of the heat sink 10 defines an elongated groove 18 through a middle portion thereof, receiving the clip 30 therein. The groove 18 is perpendicular to the fins, and extends through the fin assembly 16.

The retention frame 20 is substantially rectangular, which includes a pair of opposite long bars 21 and a pair of opposite short bars 23 interconnecting together. Cooperatively the four bars 21, 23 of the retention frame 20 define a rectangular space 26. The retention frame 20 is securely mounted on the circuit board 40, and receives the electronic component 41 in the space 26 thereof. A pair of mounting holes 22 extend through the pair of opposite short bars 23 of the retention frame 20, respectively, for extension of screws therethrough to assemble the retention frame 20 onto the circuit board 40. A pair of catches 24 extend outwardly and oppositely from the two short bars 23 of the retention frame 20, respectively. Each of the pair of catches 24 is located substantially at a middle of one corresponding short bar 23, adjacent to the corresponding mounting hole 22.

Figure 3:
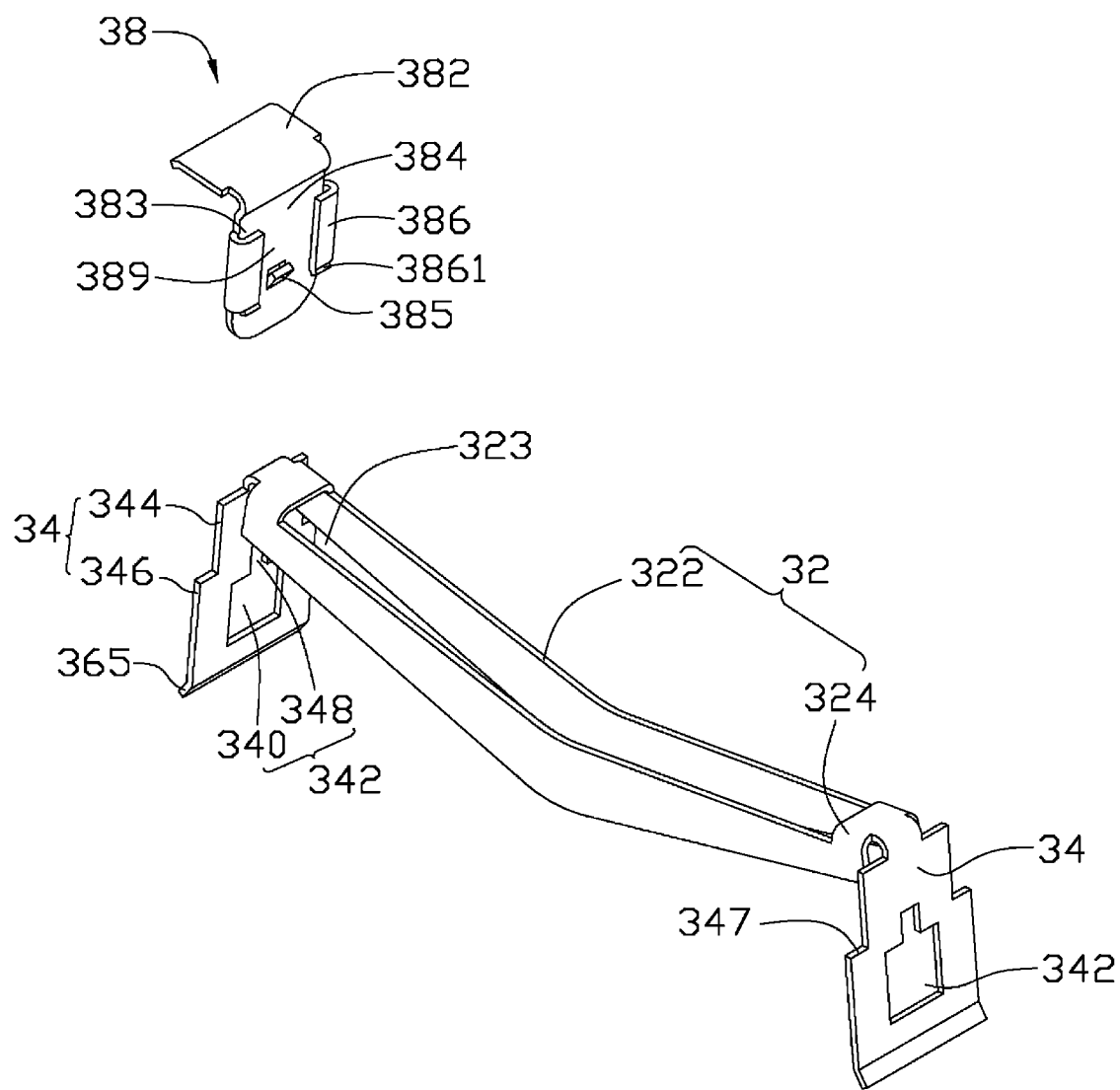
FIG. 3 is an exploded view of a clip of the heat dissipation device of FIG. 2.
Figure 4:
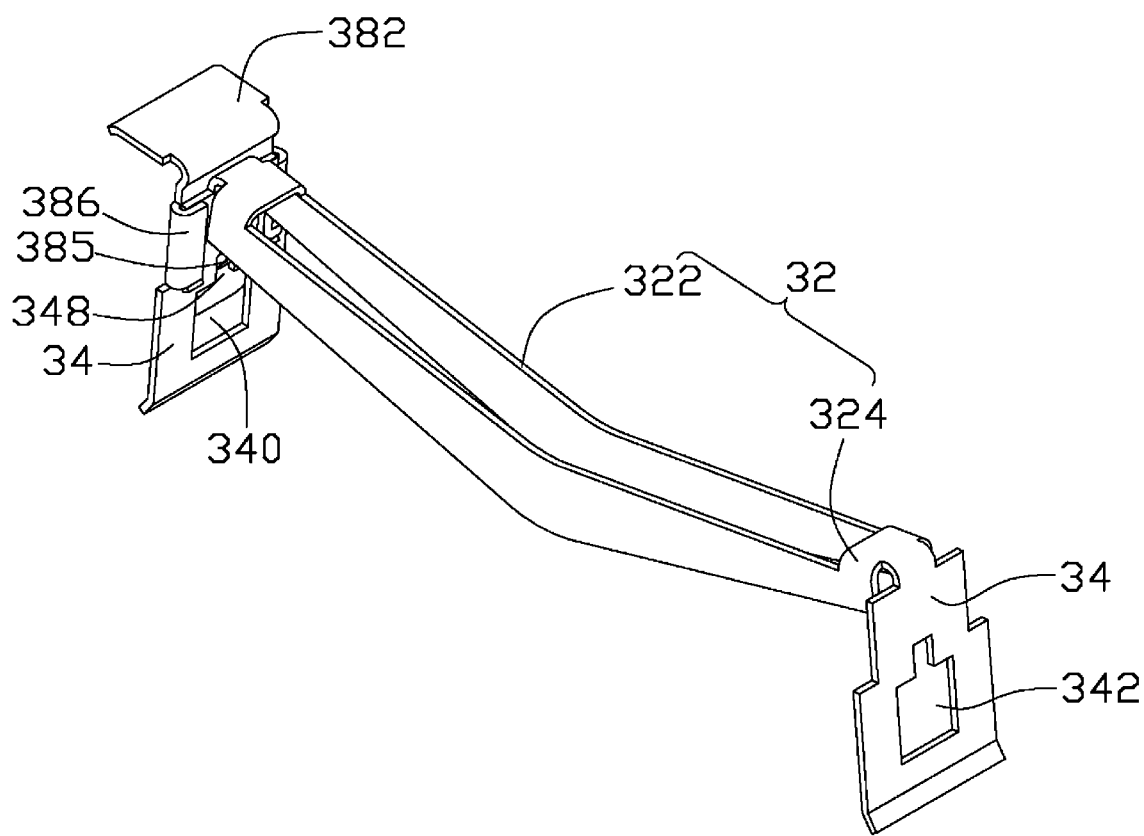
FIG. 4 is an assembled view of the clip of FIG. 3.

Referring to FIGS. 3 and 4, the clip 30 includes an elongated resilient main body 32, a pair of locking members 34, and a securing member 38. The main body 32 includes a pair of elongated resilient arms 322 parallel to and spaced from each other. Each of the resilient arms 322 is a substantially V-shaped sheet. An elongated groove 323 is defined between the pair of resilient arms 322, for conserving material and increasing resilience of the clip 30. A pair of connecting planes 324 are integrally and respectively formed at two opposite ends of the main body 32. Each of the connecting planes 324 is flat, and interconnects corresponding ends the pair of elongated resilient arms 322 at top sides thereof.

The pair of locking members 34 are the same as each other, and extend integrally and downwardly from the pair of the connecting planes 324 of the main body 32, respectively. The securing member 38 is assembled onto one of the locking members 34. As shown in FIG. 4, the locking members 34 are respectively formed at left and right sides of the main body 32, and the securing member 38 is assembled onto the locking member 34 at the left side of the main body 32. Alternatively, the securing member 38 can be assembled onto the locking member 34 at the right side of the main body 32.

Each of the locking members 34 includes an upper portion 344 and a lower portion 346. The upper portion 344 connects to the corresponding connecting plane 324 of the main body 32, and is substantially perpendicular to the main body 32. The lower portion 346 extends downwardly from the upper portion 344, and has a width larger than that of the upper portion 344. A step 347 is formed at a junction of the upper portion 344 and the lower portion 346. A guiding portion 365 is formed at a bottom side of the lower portion 346, and slants to lower left for increasing a distance between bottom sides of the pair of locking members 34 and facilitating an engagement of the locking members 34 with the catches 24.

An aperture 342 is defined in each of the locking members 34. The aperture 342 includes a locking hole 340 and an engaging hole 348 communicating with each other. The locking hole 340 is formed in the lower portion 346 of the locking member 34 with a top side thereof being slightly lower than the step 347 of the locking member 34. The engaging hole 348 of the aperture 342 extends from a middle of the top side of the engaging hole 348 into the upper portion 344 of the locking member 34. A width and height of the engaging hole 348 is much smaller than that of the locking hole 340.

The securing member 38 includes a handling portion 382 and an engaging portion 384. The handling portion 382 is substantially horizontal, being a flat sheet. The engaging portion 384 is substantially vertical, extending downwardly from a right side of the handling portion 382. A width of the engaging portion 384 is substantially the same as that of the upper portion 344 of the locking member 34, and a height of the engaging portion 384 is larger than that of the upper portion 344 of the locking member 34.

A pair of flanges 386 are formed at front and rear sides of the engaging portion 384, which extend firstly rightwards and then toward each other. The flanges 386 bend rightwards respectively from a middle of the front side and the rear side of the engaging portion 384, and then extend towards each other. Each flange 386 has a height smaller than that of the engaging portion 384, and approximately equal to that of the upper portion 344 of the locking member 34. A width of each flange 386 is smaller than a half of the engaging portion 384, and thus a gap 389 is defined between free ends of the pair of flanges 386. The flanges 386 are substantially parallel to the engaging portion 384, and a clearance 383 is defined between the engaging portion 384 and the flanges 386 for accommodating the upper portion 344 of the locking member 34. A guiding ear 3861 is formed at a bottom side of each engaging portion 384, and slants to lower right for widening the clearance 383 at the bottom sides of the flanges 386 to facilitate an insertion of the upper portion 344 of the locking member 34 into the clearance 383.

A hook 385 extends rightward from the engaging portion 384. The hook 385 is integrally formed with the engaging portion 384 by, for example, punching the engaging portion 384. A bore 387 is defined in the engaging portion 384 at a position corresponding to the hook 385. The hook 385 is elastic and can rotate back into the bore 387 when subjects to a force large enough. The hook 385 is located slightly higher than bottom sides of the flanges 386, and at a middle of the engaging portion 384 between the front and rear sides thereof. That is, the hook 385 is located amid the flanges 386 of the engaging portion 384 along a front-to-rear direction of the engaging portion 384. A size and a shape of the hook 385 are substantially the same as those of the engaging hole 348 of the aperture 342.

In pre-assembly of the clip 30, the securing member 38 is aligned with the left locking member 34. A bottom of the right side of the engaging portion 384 abuts a top of a left side of the upper portion 344 of the locking member 34. Then the handling portion 382 of the securing member 38 is pressed downwardly to cause the engaging portion 384 to move downwardly. At this time, the upper portion 344 of the locking member 34 moves into the clearance 383 of the securing member 38. For the guiding ears 3861 formed at the bottom sides of the flanges 386 which widen the clearance 383, it is easy for the upper portion 344 of the left locking member 34 to slide into the clearance 383.

When the hook 385 of the securing member 38 moves downwardly to abut the upper portion 344 of the locking member 34, the hook 385 rotates back into the bore 387 due to the urging force exerted by the upper portion 344 of the locking member 34 acting on the hook 385. Thus the securing member 38 can move continuously until the bottom sides of the flanges 386 abutting and blocked by the step 347 of the left locking member 34. In this state, the hook 385 resumes its free state, and extends into the engaging hole 348 of the aperture 342. Thus the clip 30 is assembled together.

As described above, the clip 30 is just constructed by two separate elements, i.e., the main body 32 with integrally formed locking members 34, and the securing member 38. Thus a cost for the clip 30 is relatively low, and assembly of the clip 30 is simple and quick. In addition, after assembling, the securing member 38 can not move upwardly for the engagement of the hook 385 into the engaging hole 348 of the locking member 34, and can not move downwardly for the engagement between the step 347 and the flanges 386. Furthermore, the upper portion 344 of the locking member 34 received between the flanges 386 and the engaging portion 384 forbids movement of the securing member 38 in the front-to-rear direction and the left-to-right direction. Therefore, the clip 30, after assembling, has a robust and firm structure, and the securing member 38 can not fall off from the clip 30.

Referring back to FIGS. 1 and 2, for assembling the heat sink 10, the base 12 of the heat sink 10 is attached onto the electronic component 41, and the main body 32 of the clip 30 is received in the groove 18 of the heat sink 10 with locking members 34 thereof located at two opposite sides of the heat sink 10. Firstly, the right locking member 34 without the securing member 38 is secured to the retention frame 20 with one corresponding catch 24 engaging into the locking hole 340 thereof. The guiding portion 365 formed at the bottom side of the lower portion 346 of the right locking member 34 can facilitate the catch 24 of the retention frame 20 engaging into the locking hole 340.

After the right locking member 34 is assembled with the retention frame 20, the securing member 38 is pressed to cause the main body 32 of the clip 30 to deform, and thus the left locking member 34 with the securing member 38 mounted thereon moves downwardly until the other catch 24 engages into the locking hole 340 of the left locking member 34. Thus the heat sink 10 is secured onto the electronic component 41. The resilient arms 322 of the main body 32 of the clip 30 exert a downward force on the heat sink 10 whereby the heat sink 10 maintains an intimate and thermal contact with the electronic component 41 to dissipate heat generated thereby. The catches 24 of the retention frame 20 tightly engage with the locking members 34 at bottoms of the apertures 342 by elastic restoring force of the resilient arms 322 of the main body 32 of the clip 30.

Figure 5:
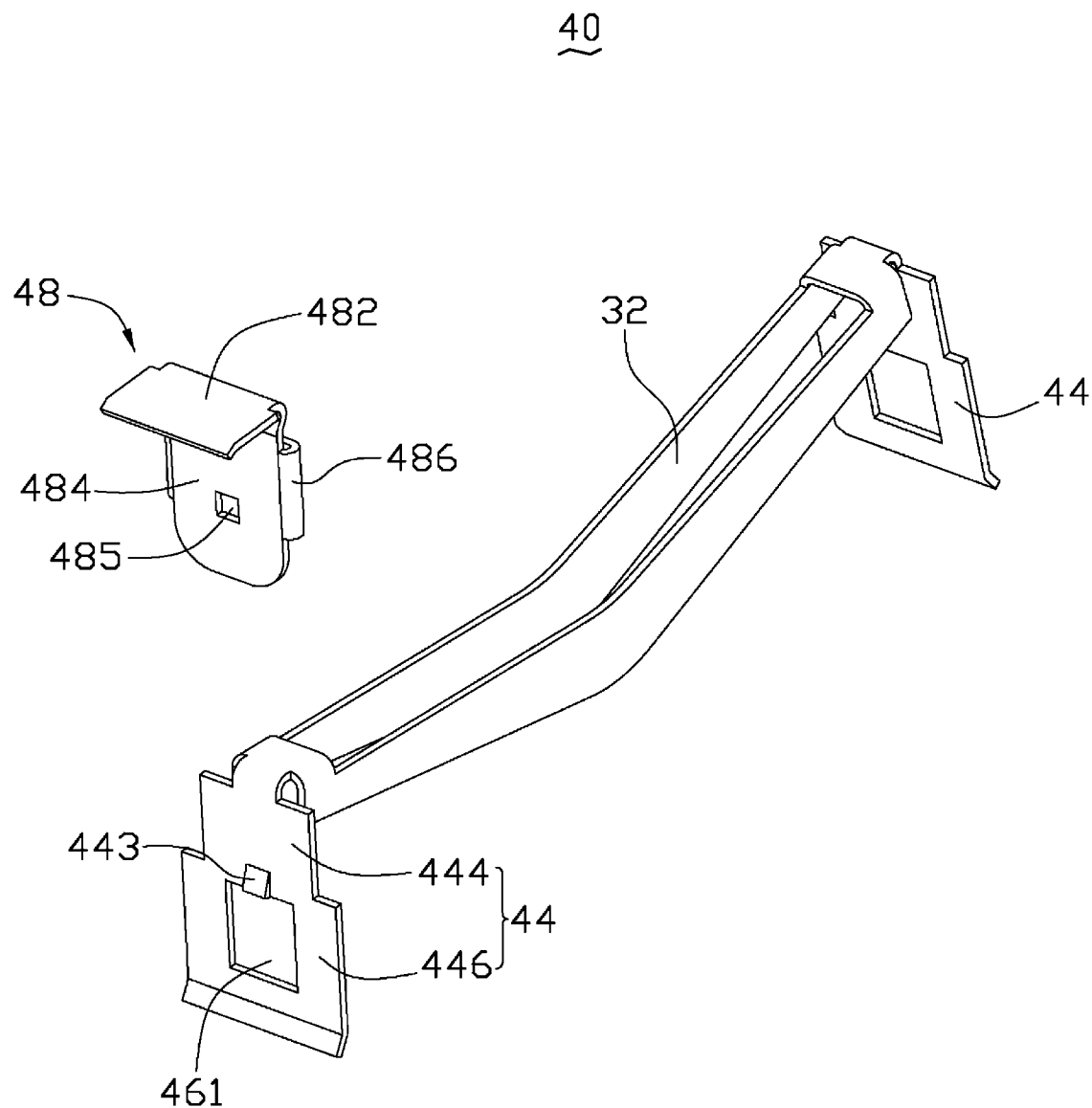
FIG. 5 is an exploded view of a clip in accordance with a second embodiment.

Referring to FIG. 5, a clip 40 according to a second embodiment includes an elongated main body 32 with a pair of locking members 44 integrally extending from two opposite ends thereof, and a securing member 48. The securing member 48 includes a handling portion 482, an engaging portion 484, and a pair of flanges 486 formed at front and rear sides of the engaging portion 484, respectively. An engaging hole 485 is defined in the engaging portion 484 near bottom sides of the flanges 486.

Each locking member 44 includes an upper portion 444 and a lower portion 446. A square-shaped locking hole 461 is defined in the lower portion 446 of each locking member 44 for engaging with the catch 24 of the retention frame 20. A hook 443 is formed on the left locking member 44 at a top side of the locking hole 461. The hook 443 is located at a left side the left locking member 44 for engaging with the engaging hole 485 of the securing member 48. Thus when the upper portion 444 of the locking member 44 is inserted between the flanges 486 and the engaging portion 484 to assemble the clip 40, the hook 443 extends into the engaging hole 485 of the engaging portion 484 when the flanges 486 are moved downwardly to abut and be blocked by the step of the left locking member 44.

Figure 6:
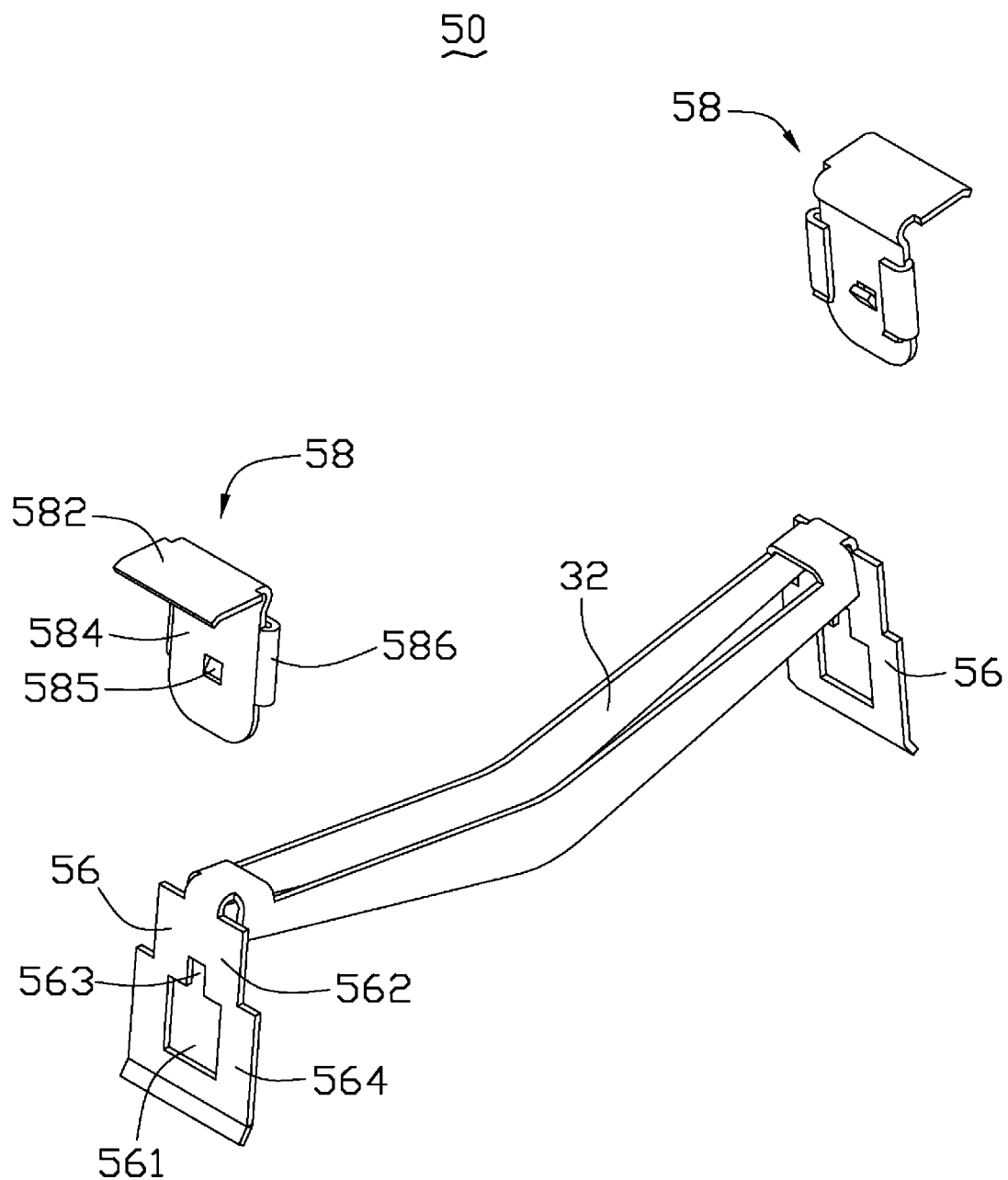
FIG. 6 is an exploded view of a clip in accordance with a third embodiment.

FIG. 6 shows a clip 50 according to a third embodiment, which includes a main body 32, a pair of locking members 56, and a pair of securing members 58. The main body 32, the locking members 56 of this embodiment are the same with the main body 32 and the locking members 34 of the clip 30 of the first embodiment. The pair of securing members 58 are the same as each other, and each of the securing members 58 is the same as the securing member 38 of the clip 30 in accordance with the first embodiment.

Each locking member 56 includes an upper portion 562, a lower portion 564, a locking hole 561 defined in the lower portion 564, and an engaging hole 563 extending from the locking hole 561 into the upper portion 562. Each securing member 58 includes a handling portion 582, an engaging portion 584, a pair of flanges 586 formed at front and rear sides of the engaging portion 584, respectively, facing the main body 32, and a hook 585 slanting upwardly from the engaging portion 584 toward the main body 32. Each securing member 58 is secured onto one locking member 56 in a manner as that disclosed in connection with the first embodiment. Thus when securing the heat sink 10 to the electronic component 41, a force can be put at the two securing members 58 at two ends of the clip 50. Thus a deformation of the clip 50 can be enhanced, and assembly of the heat sink 10 is easier.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip for securing a heat sink to a heat generating electronic component, comprising:
an elongated main body, the main body being V-shaped and resilient;
a pair of locking members integrally and respectively formed at two opposite ends of the main body, each of the pair of locking members defining a locking hole therein, one of the pair of locking members having an upper portion, a lower portion with a width larger than that of the upper portion, a step formed at a junction of the upper and lower portions, and an engaging hole located above and opening into the locking hole of the one of the pair of locking members; and
a securing member secured onto the one of the pair of locking members, the securing member comprising a handling portion, an engaging portion extending downwardly from the handling portion, and a pair of flanges formed at front and rear sides of the engaging portion, respectively, facing the main body and abutting the step, a clearance being defined between the flanges and the engaging portion receiving the upper portion of the one of the pair of locking members, and the engaging portion forming a hook located at the side of the engaging portion facing the main body and engaging into the engaging hole of the one of the pair of locking members, the engaging hole and the hook being higher than the locking hole.

2. The clip of claim 1, wherein the hook is located at a level which is no lower than that of bottom sides of the flanges.

3. The clip of claim 2, wherein the pair of flanges bend from the front and rear sides of the engaging portion, respectively, towards each other, a gap is defined between free ends of the pair of flanges, and the hook is located in the gap.

4. The clip of claim 1, wherein the engaging hole is located at a level which is no lower than that of bottom sides of the flanges.

5. The clip of claim 1, wherein the other one of the pair of locking members comprises a second upper portion, a second lower portion with a width larger than that of the second upper portion, and a second step formed at a junction of the second upper and second lower portions of the other one of the pair of locking members, the clip further comprising another securing member assembled onto the other one of the pair of locking members.

6. The clip of claim 1, wherein a guiding ear slants downwardly from a bottom side of each flange towards the main body for widening the clearance at the bottom side of the each flange.

7. A heat dissipation device, comprising:
a heat sink comprising a plurality of stacked fins, a groove extending through the heat sink; and
a clip comprising an elongated resilient main body received in the groove of the heat sink, a pair of locking members integrally extending from the main body and located at two opposite sides of the heat sink, and a securing member secured onto one of the pair of locking members, the one of the pair of locking members comprising an upper portion, a lower portion with a width larger than that of the upper portion, a step formed at a junction of the upper and lower portions, a locking hole, and an engaging hole located above and opening into the locking hole, the securing member comprising a handling portion, an engaging portion extending downwardly from the handling portion, the engaging portion forming a hook engaging into the engaging hole of the one of the pair of locking members, the hook is located at a lateral side of the engaging portion facing the main body, and a pair of flanges formed at front and rear sides of the engaging portion, respectively, facing the main body and abutting the step, a clearance being defined between the flanges and the engaging portion receiving the upper portion of the one of the pair of locking members.

8. The heat dissipation device of claim 7, further comprising a retention frame surrounding a base of the heat sink, the retention frame forming a pair of catches at opposite sides thereof, a second one of the pair of locking members defining a second locking hole, the locking hole and the second locking hole engagingly receiving with a corresponding ones of the catches of the retention frame, the engaging hole and the hook being at a level which is no lower than that of the locking hole and the second locking hole.

9. The heat dissipation device of claim 8, wherein a pair of through holes are defined in the opposite sides of the retention frame for screwing the retention frame to a printed circuit board.

10. The heat dissipation device of claim 8, wherein the level of the hook being no lower than a level of bottom sides of the flanges.

11. The heat dissipation device of claim 10, wherein the pair of flanges bend from the front and rear sides of the engaging portion, respectively, towards each other, a gap is defined between free ends of the pair of flanges, and the hook is located in the gap.

12. The heat dissipation device of claim 7, wherein a guiding ear slants downwardly from a bottom side of each flange towards the main body for widening the clearance at the bottom side of the each flange.

13. A clip for securing a heat sink to a heat generating electronic component, the clip comprising:

an elongated main body, the main body being V-shaped and resilient;

a pair of locking members integrally and respectively formed at two opposite ends of the main body, each of the pair of locking members defining a locking hole therein, one of the pair of locking members having an upper portion, a lower portion with a width larger than that of the upper portion, a step formed at a junction of the upper and lower portions, and a hook, a bottom edge of the hook being substantially at the same level as a top edge of the locking hole; and a securing member secured onto the one of the pair of locking members, the securing member comprising a handling portion, an engaging portion extending downwardly from the handling portion, and a pair of flanges formed at front and rear sides of the engaging portion, respectively, facing the main body and abutting the step, a clearance being defined between the flanges and the engaging portion defining an engaging hole, the engaging hole receiving the hook of the one of the pair of locking members.

\* \* \* \* \*